United States Patent [19]

Sandhu et al.

[11] Patent Number: 5,377,429
[45] Date of Patent: Jan. 3, 1995

[54] METHOD AND APPARTUS FOR SUBLIMING PRECURSORS

[75] Inventors: Gurtej S. Sandhu; Scott G. Meikle; Donald L. Westmoreland, all of Boise, Id.

[73] Assignee: Micron Semiconductor, Inc., Boise, Id.

[21] Appl. No.: 49,565

[22] Filed: Apr. 19, 1993

[51] Int. Cl.$^6$ .............................................. F26B 13/30
[52] U.S. Cl. ........................................... 34/586; 34/92; 34/408; 118/715
[58] Field of Search ................ 34/10, 92, 15, 57 R, 34/57 A, 57 B, 60, 576, 586, 359, 361, 368, 408; 156/613; 432/205; 427/248.1, 250, 252, 253; 118/715

[56] References Cited

U.S. PATENT DOCUMENTS

| | | | |
|---|---|---|---|
| 4,421,592 | 12/1983 | Shuskus et al. | 156/613 |
| 4,609,424 | 9/1986 | Shuskus et al. | 156/613 |
| 4,916,828 | 4/1990 | Yamane et al. | 34/586 |
| 4,982,019 | 1/1991 | Purdy et al. | 568/842 |

*Primary Examiner*—Henry A. Bennett
*Attorney, Agent, or Firm*—Stephen A. Gratton

[57] ABSTRACT

An improved method and apparatus are provided for subliming solid precursors, and especially organometallic precursors, for use in a chemical vapor deposition (CVD) process. The sublimation apparatus includes a sealed vessel having a vacuum chamber. A quantity of the solid precursor is mixed with a loosely packed particulate material, such as ceramic beads, placed within the vacuum chamber. The vacuum chamber and particulate material are heated. A supply of a carrier gas is directed through the particulate material (particularly through pockets formed in the particulate material) to sublime the precursor which coats the individual particles of particulate material. By agitating the particulate material, a relatively constant sublimation area is maintained. Agitation of the particulate material may be with a mechanical stirrer or by directing an a.c. field through a piezoelectric particulate material.

11 Claims, 1 Drawing Sheet

METHOD AND APPARTUS FOR SUBLIMING PRECURSORS

FIELD OF THE INVENTION

This invention relates generally to thin film deposition processes and more particularly to a method and apparatus for subliming precursors, especially organometallic precursors. The method and apparatus of the invention are particularly suited for use with chemical vapor deposition (CVD) processes during the manufacture of semiconductor integrated circuits.

BACKGROUND OF THE INVENTION

In the manufacture of integrated circuits, various thin films are deposited and patterned on a semiconducting substrate. One well known deposition process is chemical vapor deposition (CVD). In general, chemical vapor deposition (CVD) is a process in which a substrate (e.g. wafer) is heated and coated with vapors of volatile chemical compounds at a temperature below the melting point of the substrate. During CVD, a precursor compound, in a vapor or gaseous state, is reduced or dissociated, in a chemical reaction on the substrate surface, thereby resulting in an adherent coating deposited on the substrate.

In semiconductor manufacture, CVD is used to produce epitaxially grown single crystal silicon by the reduction of a silicon precursor such as silicon tetrachloride ($SiCl_4$) by a reactant gas such as hydrogen. This process is used to make epitaxial compounds such as polysilicon, silicon nitride, silicon dioxide, and both doped polysilicon and silicon dioxide. Chemical vapor deposition is also utilized in semiconductor manufacture in the deposition of various conductive films such as aluminum, copper, titanium, nichrome and platinum.

Recent advancements in semiconductor manufacture have led to increases in the density and miniaturization of microelectronic circuits. This has necessitated the use of new materials and accelerated the development of improved deposition techniques including chemical vapor deposition (CVD) for these materials. One improved CVD process for depositing high performance conductive films is known as metal organic chemical vapor deposition (MOCVD). With MOCVD, an organometallic compound is used as a precursor for the deposition material. Such organometallic precursors permit the deposition process to be performed at lower temperatures and with the incorporation of fewer impurities.

As an example, titanium nitride (TiN) films which are widely used in many advanced metallization schemes, can be deposited by MOCVD. For depositing titanium nitride, an organometallic precursor of titanium may be a dialkylamino-derivative, such as tetrakis-dimethyl-amino titanium [$Ti(N(CH_3)_2)_4$] (TDMAT).

One limitation in the use of an organometallic precursors for CVD is that the majority of organometallic compounds with attributes desirable for CVD are solids. With a solid organometallic precursor, the solid phase material must be transformed directly to the vapor phase without passing through the liquid phase. This conversion from solid to vapor phase is known as sublimation. Volatility is the tendency of a solid material to pass into the vapor state at a given temperature.

For CVD, an organometallic compound must be volatile, have sufficient stability to transport to the deposition site, and decompose cleanly giving the desired material. Many organometallic compounds have the chemical stability molecular structure and reactivity which makes them ideally suited for CVD applications. The difficulty of subliming or transforming the solid material to a vapor phase, however, is a major hindrance to their implementation in a production environment.

As an example, it may be difficult to achieve a rate of sublimation or organometallic precursors that is fast enough for a production throughput. Further, it may be difficult to maintain a consistent delivery rate of a precursor gas over the course of a deposition process (i.e. the delivery rate decreases as the deposition process proceeds).

FIG. 1 illustrates a prior art method for subliming a solid precursor during a CVD deposition process. A CVD reactor 10 includes solid precursors 12 contained at the bottom of a sealed reaction chamber 14. The reaction chamber 14 is connected to a vacuum source 22. Different precursor compounds may be mixed in a ratio to provide a desired stoichiometric composition for the precursor gas. The solid precursors 12 are heated by a heat bath 16 to a temperature sufficient to cause the sublimation of the precursors 12 to a vapor state and form a precursor gas. A substrate 18 is mounted above the precursor 12. The substrate 18 is heated by a power supply 20 to a temperature which causes the precursor gas within the reaction chamber 14 to decompose and deposit onto the substrate 16.

With such a prior art CVD deposition process, it may be difficult to achieve an acceptable rate of sublimation of the precursor. In addition, it may be difficult to maintain a consistent and uniform delivery of the precursor gas throughout the deposition process. Furthermore, temperature fluctuations caused by the sublimation reaction may adversely affect the rate and uniformity of the sublimation process.

As is apparent then, there is a need in the art for improved methods and apparatus for subliming materials. Particularly in semiconductor manufacture, there is a need for improved methods and apparatus for subliming organometallic precursors during CVD at a rate fast enough to allow an acceptable production throughput. It is also desirable in semiconductor manufacture to control the sublimation process during CVD to provide a uniform supply of the precursor gas throughout the duration of the deposition process.

Accordingly, it is an object of the present invention to provide an improved method and apparatus for subliming precursors and in particular solid organometallic precursors. It is a further object of the present invention to provide an improved method and apparatus for subliming solid organometallic precursors suitable for use in a chemical vapor deposition (CVD) process. It is yet another object of the present invention to provide an improved method and apparatus for achieving a high rate of sublimation of a solid precursor and a uniform delivery of a precursor gas. It is yet another object of the invention to provide an improved method and apparatus for subliming solid organometallic precursors that are efficient, low cost and adaptable to large scale semiconductor manufacture.

SUMMARY OF THE INVENTION

In accordance with the present invention, an improved method and apparatus for subliming solid precursors and in particular solid organometallic precursors are provided. The method of the invention, broadly stated, comprises mixing a solid precursor with a particulate material, such as spherical ceramic beads, in order to maximize a surface area for sublimation. During the sublimation process, the particulate material and precursor are heated while an inert carrier gas is directed through the particulate material. In an illustrative embodiment of the invention the method is used to provide a precursor gas useful for chemical vapor deposition (CVD) during semiconductor manufacture.

An apparatus for performing the method of the invention includes a vacuum chamber in fluid communication with a supply of a carrier gas and with the vacuum chamber of a CVD reactor. A quantity of a loosely packed particulate material is located within the sealed chamber. The solid precursor is mixed into the particulate material and heated. The particulate material is of a consistency and looseness that provides gas voids or passageways through the particulate material for the carrier gas.

Further, the particulate material provides a large total surface area for exposing the precursor to the carrier gas and for heating the precursor. With a large exposed surface area, the rate of sublimation of the precursor into the carrier gas can be increased. In addition, the particulate material and precursor are continually stirred or agitated to break up the solid precursor and to expose more of the precursor to the carrier gas.

In a first embodiment of the invention, the particulate material includes spherically shaped ceramic beads contained at the bottom of the sealed chamber. The ceramic beads are heated and mechanically agitated with a motorized impellor. The precursor is mixed with the ceramic beads. The ceramic beads provide an increased surface area for heating and subliming the precursor and multiple pockets or voids for circulating a carrier gas around the precursor. The pockets taken in the aggregate provide passageways for the flow of the carrier gas through the ceramic beads.

Initially the vacuum chamber is closed. The action of the heating and agitation causes the precursor to break up, sublime and then redeposit onto surfaces within the sealed chamber, including the ceramic beads. With a sufficient quantity of precursor material, all of the ceramic beads will become coated with redeposited precursor material. When the system is opened and the carrier gas is flowed through the ceramic beads (with the impellor still in motion), precursor material will sublime from the surfaces of the coated ceramic bead producing the precursor gas. The precursor gas can then be directed out of the system for use, (e.g. into the vacuum chamber of a CVD reactor). As the process continues, the ceramic beads are continuously agitated by the impellor and different gas pockets and passageways through the material are formed. This exposes different coated surfaces of the ceramic beads to the carrier gas.

If the density of the precursor material is less than that of the ceramic beads, the precursor material will tend to move with constant agitation vertically upward towards the top most beads within the sealed chamber. If the density of the precursor material is greater than that of the ceramic beads, the precursor material will tend to settle towards the bottom most beads within the sealed chamber. The precursor material must therefore also be dispersed in a generally vertical direction over the ceramic beads to overcome the effects of gravity and prevent the separation of the ceramic beads and precursor.

Because all of the ceramic beads are coated and the beads constitute most of the internal surface area of the system, the sublimation surface area will be constant, resulting in a constant net material sublimation rate. Furthermore, because ceramics have a high heat capacity, temperature fluctuations due to heat removal by sublimation will be reduced. This will yield a controlled delivery of the precursor gas similar to a liquid evaporation delivery system.

In an alternate embodiment of the invention, agitation of the particulate material is accomplished by vibration instead of by mechanical stirring. In the alternate embodiment, the particulate material is formed of piezoelectric particles (e.g. quartz, Rochelle salt, barium titanate). Two electrodes, capable of inducing a high frequency a.c. electric field, are placed around the sealed chamber for generating an induced voltage for the piezoelectric particles to vibrate. Application of the a.c. field thus causes the piezoelectric particles to vibrate. As before, this agitates and breaks up the precursor and continually exposes a constant sublimation area of precursor material to the carrier gas.

Other objects, advantages, and capabilities of the present invention will become more apparent as the description proceeds.

DETAILED DESCRIPTION OF THE PREFERRED EMBODIMENT

As used herein, the term "sublimation" refers to the vaporization of a solid without the intermediate formation of a liquid. "Sublime" refers to the process of sublimation.

Figure 2:
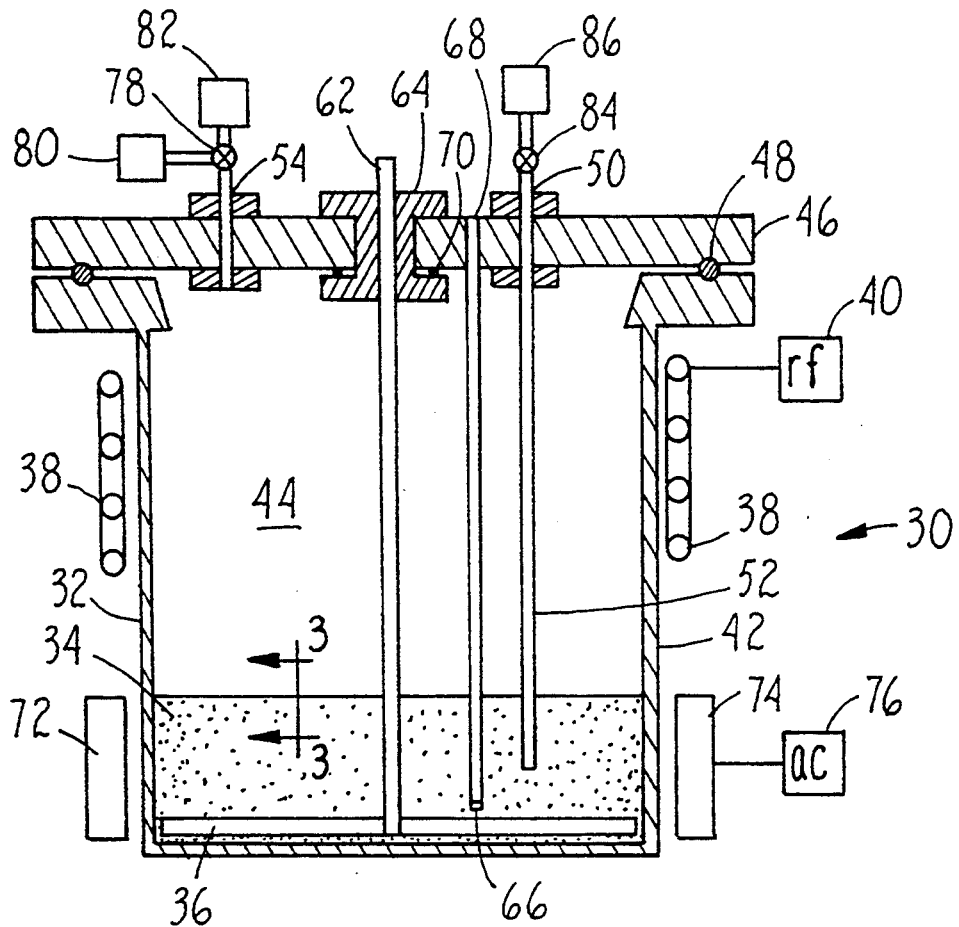
FIG. 2 is a schematic diagram of a sublimation apparatus constructed in accordance with the invention for subliming a solid precursor.

Referring now to FIG. 2, a sublimation apparatus constructed in accordance with the invention is shown and generally designated as 30. The sublimation apparatus 30, generally stated, includes: a sealed container 32 in fluid communication with a supply of a carrier gas; a quantity of a particulate material 34 contained within the sealed container 32; means for agitating the particulate material 34 in the form of a rotatable impeller 36; and means for heating the system in the form of an induction heating coil 38 coupled to an rf power supply 40.

The sealed container 32 may be constructed as a sealed vessel or ampule. The sealed container 32 includes a flanged hollow body portion 42. A cover plate 46 is removably attached to the body portion 42 to form a sealed vacuum chamber 44. A gasket 48 (or o-ring) seals the connection between the cover plate 46 and the body portion 42 of the sealed container 32.

The cover plate 46 includes an inlet port 50 that is in fluid communication with a carrier gas supply 86. A suitably valved manifold 84 may be connected to the inlet port 50 for controlling the flow rate and pressure of the carrier gas into the vacuum chamber 44. The carrier gas may be an inert gas such as argon, helium or neon. A gas conduit 52 extends from the inlet port 50 into the particulate material 34. The gas conduit 52 functions to direct the carrier gas into the particulate material 34.

An outlet port 54 on the cover plate 46 is in fluid communication with the vacuum chamber 44. The outlet port 54 receives the precursor gas formed within the vacuum chamber 44. The outlet port 54 is adapted for fluid communication with a vacuum chamber of an apparatus such as a CVD reactor 80, that requires a supply of the precursor gas under a vacuum. The vacuum within the vacuum chamber 44 may be generated by connection with the CVD reactor 80 or the outlet port 54 may be connected to a separate vacuum source 82 (e.g. turbo pump). A suitably valved manifold 78 may control gas flow of the precursor gas through the outlet port 54.

Figure 1:
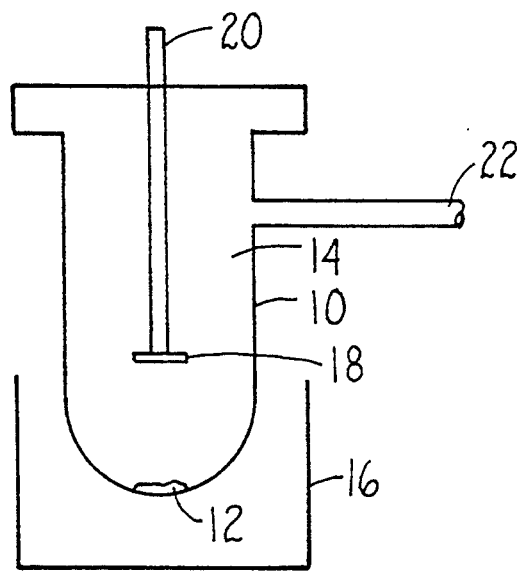
FIG. 1 is a schematic diagram of a prior art CVD reactor illustrating the sublimation of a solid precursor.
Figure 3:
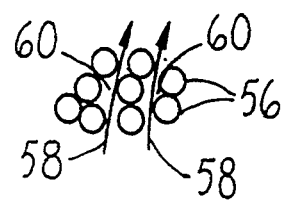
FIG. 3 is an enlarged cross section schematic view taken along section line 3—3 of FIG. 2 showing the circulation of a carrier gas through the particulate material of the sublimation apparatus.

The particulate material 34 is placed at the bottom of the sealed container 32 within the vacuum chamber 44. In the illustrative embodiment of the invention, the particulate material 34 comprises ceramic beads 56 (FIG. 3). The ceramic beads 56 are of a shape and size that allows them to be loosely packed within the sealed container 32. By way of example, the ceramic beads 56 may be generally spherical in shape and have a diameter of approximately 1–2 mm. The ceramic beads may fill about ¼ to ½ of the total volume of the vacuum chamber 44.

In general, the ceramic beads 56 provide a large total surface area for heating and subliming the precursor. In addition, as shown in FIG. 3, the loose packing of the ceramic beads 56 provides a large number of voids or pockets 60 between adjacent ceramic beads 56. Taken in the aggregate, these pockets 60 form passageways for the flow of the carrier gas through the ceramic beads 56 (and around the precursor material coated on the ceramic beads 56) as indicated by arrows 58.

Alternately, in place of ceramic beads 56, the particulate material 34 may be formed of any inert material in a particle form (i.e. grains, beads, crushed particles) which can be coated with precursor material to provided an increased surface area for sublimation. Another requirement is that the individual particles of the particulate material 34 must be of a size and shape to provide air pockets 60 between adjacent particles to permit the carrier gas to be circulated through the individual particles. Finally, the particulate material 34 must be strong enough to stand up to continuous agitation (i.e. stirring, vibration) without breaking up. Suitable particulate materials other than ceramic beads include metal beads.

In a first embodiment of the invention, the ceramic beads 56 are mechanically agitated by the rotatable impellor 36. The impellor 36 is attached to a drive shaft 62 which is coupled to a drive motor (not shown). The impellor is journaled for rotation on a vacuum sealed bearing 64. As an example, the impellor 36 may be continuously rotated at a speed of approximately 10–20 rpms. An o-ring 70 seals the mounting of the bearing 64 with the cover plate 46 of the sublimation apparatus 30. The impellor 36 contacts the ceramic beads 56 and moves the beads 56 around as it is rotated.

If the ceramic beads 56 and particulate material 34 have different densities, the particulate material 34 will also need to be dispersed uniformly in a vertical direction to avoid separation of the beads 56 and particulate material 34. This can be done manually or by imparting an up and down movement to the motion of the impellor 36. The impellor 36 can therefore be shaped or moved to impart both an up and down and a side to side motion to the particulate material 34.

The most desirable situation is with the beads having a higher density than the particulate material 34. In this case the beads will tend to move towards the bottom of the sealed container 32 and the precursor material towards the top.

Rotation of the impellor breaks up the precursor and exposes different surfaces of the ceramic beads 56, which become coated with the precursor, to the carrier gas. Thus although new precursor material is continually exposed to the carrier gas, the overall surface area for subliming (i.e. subliming surface area) remains constant. This also helps to maintain a constant sublimation rate throughout a deposition process.

The induction heating coil 38 for heating the vacuum chamber 44 is located external to the vacuum chamber 44. The induction heating coil 38 is operated by the rf power supply 40. The power supply is controlled by feedback from a thermocouple embedded within the ceramic beads 56. A thermocouple tube 68 connects the thermocouple 66 to suitable controls (not shown) which may be constructed to maintain the vacuum chamber 44 at a controlled temperature. Alternately, heating means other than the one shown may be used to heat the system to a temperature suitable for sublimation. Depending on the precursor material this temperature may be in the range of 30° C. to 500° C.

With ceramic beads 56 used as a particulate material, a large thermal mass provides for efficiently heating the precursor material. In addition, this large thermal mass prevents temperature fluctuation that can cause fluctuations in the sublimation rate.

OPERATION

In operation of the sublimation apparatus 30, the solid precursor material is initially mixed in with the ceramic beads 56. The precursor material may be in a solid particle form or a powder form. Moreover, different precursors may be combined in a desired stoichiometric composition.

At the start of the process, a vacuum is generated within the vacuum chamber 44. At this time there is no carrier gas flow through the gas conduit 52. The entire system including the vacuum chamber 44, ceramic beads 56 and precursors are heated by the induction heating coil 38. The impellor 36 is rotated to continuously agitate the ceramic beads 56 and precursor.

Initially the sublimation apparatus 30 is a closed system. The action of the heating and agitation of the ceramic beads 56 and precursor causes the precursor to break up, sublime and then redeposit uniformly onto surfaces within the vacuum chamber 44 including the ceramic beads 56. Eventually all of the ceramic beads 56 become coated with redeposited precursor material.

After an initial heating/stirring period sufficient for all of the ceramic beads 56 to become coated, the system is opened and the carrier gas is flowed (with the impellor still in motion) through the ceramic beads 56. At the same time the outlet port 54 is connected in flow communication to the vacuum chamber of a CVD reactor (or other apparatus) that requires a flow of the precursor gas.

With all of the ceramic beads 56 coated with precursor material, a large subliming surface area will be provided. Moreover, the agitation of the ceramic beads 56 will continuously expose new precursor material to the carrier gas. The subliming surface area, however, will remain constant, resulting in a constant net material sublimation rate. Further, the high heat capacity of the ceramic beads 56 will help to minimize temperature fluctuations and also help to maintain a constant sublimation rate.

After a time, the precursor material will begin to be completely sublimed off some of the ceramic beads 56 and the sublimation rate will no longer be constant because of the diminishing subliming area. At this point the sublimation apparatus 30 must be recharged by stopping the carrier gas and impellor 36 and cooling the vacuum chamber 44, under vacuum. The cover 46 can then be removed and more precursor material can be placed within the vacuum chamber 44. After another closed vacuum heating/stirring cycle the sublimation apparatus 30 is again ready for use. Alternately, precursor material can be continuously supplied to the vacuum chamber 44 using a suitable inlet (not shown). As an example, a small opening can be provided in the cover plate 46 for dispensing precursor material as required into the vacuum chamber 44.

By way of example, the vacuum chamber can be heated to a temperature of 30° C. to 500° C. at a vacuum of from 0.01 mTorr to 10 mTorr to provide a precursor gas flow rate of from 1 sccm to 500 sccm.

ALTERNATE EMBODIMENT

In an alternate embodiment of the invention, a vibration means can be used in place of mechanical stirring for agitating the particulate material 34. As an example, the impellor 36 can be replaced with a pair of electrodes 72, 74 connected to an a.c. power supply 76. In this case the particulate material can be formed of piezoelectric particles or crystals. Suitable piezoelectric materials include quartz particles, a coarse Rochelle salt, or barium titanate particles.

Such piezoelectric particles will vibrate in response to the a.c. field generated by the electrodes. This vibration will function as a means for agitating the particulate material and exposing different precursor coated surfaces of the piezoelectric particles to the carrier gas. A relatively constant sublimation area is thus maintained. In all other respects, the operation of the alternate embodiment sublimation apparatus will be as previously described. Alternately, other vibration means such as a mechanical vibrator may be used to agitate the particulate material and provide a constant sublimation area. Moreover, mechanical agitation can by used in conjunction with one or more vibrating means.

Thus the invention provides a novel method and apparatus for subliming a solid precursor to form a precursor gas. The method of the invention is especially adapted to the sublimation of organometallic precursors for use in a CVD process during semiconductor manufacture. Although the invention has been described in terms of a preferred embodiment, it is intended that alternate embodiments of the inventive concepts expressed herein be contained within the scope of the following claims.

What is claimed is:

1. An apparatus for subliming a solid precursor comprising:

a sealable container having a vacuum chamber connected to a vacuum source and to a supply of a carrier gas;

a particulate material placed within the container and formed of individual particles of a size and shape to provide a large total sublimation area for a precursor material which coats the individual particles and with the individual particles loosely packed together to provide pockets between adjacent particles;

gas flow means associated with the container for directly the carrier gas through the particulate material and for directing a precursor gas from the vacuum chamber;

heating means associated with the container for heating the vacuum chamber and particulate material; and agitating means associated with the container for agitating the particulate material so that the carrier gas can move through the particulate material to provide a relatively constant sublimation area.

2. The apparatus as claimed in claim 1 and wherein the agitating means comprises a rotatable impeller in contact with the particulate material for moving the particulate material back and forth and up and down.

3. The apparatus as claimed in claim 1 and wherein the particulate material is formed of ceramic beads.

4. The apparatus as claimed in claim 1 and wherein the particulate material is formed of piezoelectric particles and the agitating means comprises electrodes connected to an a.c. power supply for generating an a.c. field through the piezoelectric particles for vibrating the piezoelectric particles.

5. The apparatus as claimed in claim 1 and wherein the heating means comprises an induction heating coil coupled to an rf power supply.

6. An apparatus for subliming an organometallic precursor comprising:

a container having a sealable vacuum chamber connected to a vacuum source, to a supply of a carrier gas and to an outlet for directing a precursor gas out of the vacuum chamber;

a particulate material placed within the vacuum chamber and formed of separate particles with pockets between adjacent particles for circulating the carrier gas through the particulate material;

an organometallic precursor placed within the particulate material and adapted to coat the particulate material to provide a relatively large surface area for sublimation;

agitating means for agitating the particulate material to allow the carrier gas to circulate through the precursor coated particulate material and contact the precursor; and heating means for heating the vacuum chamber, particulate material and precursor.

7. The apparatus as claimed in claim 6 and wherein the particulate material comprises ceramic beads.

8. The apparatus as claimed in claim 7 and wherein the ceramic beads are generally spherical in shape and have a diameter of about 1-2 mm.

9. The apparatus as claimed in claim 6 and wherein the agitating means comprises a motorized rotatable impeller in contact with the particulate material.

10. The apparatus as claimed in claim 6 and wherein the agitating means comprises a vibrating means for vibrating the particulate material.

11. The apparatus as claimed in claim 10 and wherein the particulate material comprises piezoelectric particles and the vibrating means comprises electrodes connected to an a.c. power supply and adapted to generate an a.c. field for vibrating the piezoelectric particles.

* * * * *